(12) United States Patent
Bao et al.

(10) Patent No.: US 11,075,281 B2
(45) Date of Patent: Jul. 27, 2021

(54) ADDITIVE CORE SUBTRACTIVE LINER FOR METAL CUT ETCH PROCESSES

(71) Applicant: INTERNATIONAL BUSINESS MACHINES CORPORATION, Armonk, NY (US)

(72) Inventors: Ruqiang Bao, Wappingers Falls, NY (US); Kisup Chung, Albany, NY (US); Andrew M. Greene, Albany, NY (US); Sivananda K. Kanakasabapathy, Niskayuna, NY (US); David L. Rath, Stormville, NY (US); Indira P. V. Seshadri, Troy, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 16/681,016

(22) Filed: Nov. 12, 2019

(65) Prior Publication Data
US 2020/0083349 A1    Mar. 12, 2020

Related U.S. Application Data

(63) Continuation of application No. 15/831,815, filed on Dec. 5, 2017, now Pat. No. 10,600,884, which is a
(Continued)

(51) Int. Cl.
| | |
|---|---|
| *H01L 21/768* | (2006.01) |
| *H01L 29/66* | (2006.01) |
| *H01L 23/535* | (2006.01) |
| *H01L 29/78* | (2006.01) |
| *H01L 29/08* | (2006.01) |

(Continued)

(52) U.S. Cl.
CPC .. *H01L 29/66545* (2013.01); *H01L 21/76865* (2013.01); *H01L 21/76895* (2013.01);
(Continued)

(58) Field of Classification Search
CPC ......... H01L 21/76865; H01L 21/76802; H01L 21/76897
See application file for complete search history.

(56) References Cited

U.S. PATENT DOCUMENTS

| | | | |
|---|---|---|---|
| 6,372,573 B2 | 4/2002 | Aoki et al. | |
| 6,387,790 B1 | 5/2002 | Domenicucci et al. | |

(Continued)

OTHER PUBLICATIONS

List of IBM Patents or Patent Applications Treated as Related dated Nov. 12, 2019, 2 pages.
(Continued)

*Primary Examiner* — Shih Tsun A Chou
(74) *Attorney, Agent, or Firm* — Tutunjian & Bitetto, P.C.; Abdy Raissinia

(57) ABSTRACT

An additive core subtractive liner method is described for forming electrically conductive contacts. The method can include forming a first trench in a first dielectric layer to expose a first portion of a metal liner, and filling said first trench with a second dielectric layer. A metal cut trench is formed in the second dielectric layer. A portion of the metal liner exposed by the metal cut trench is removed with a subtractive method. The method continues with filling the metal cut trench with a dielectric fill, and replacing the remaining portions of the second dielectric layer with an additive core conductor to provide contacts to remaining portions of the metal liner.

20 Claims, 11 Drawing Sheets

Related U.S. Application Data continuation of application No. 15/459,539, filed on Mar. 15, 2017.

(51) Int. Cl.
*H01L 29/417* (2006.01)
*H01L 21/8234* (2006.01)
*H01L 27/088* (2006.01)

(52) U.S. Cl.
CPC ........... *H01L 21/76897* (2013.01); *H01L 21/823431* (2013.01); *H01L 23/535* (2013.01); *H01L 27/0886* (2013.01); *H01L 29/0847* (2013.01); *H01L 29/41791* (2013.01); *H01L 29/66795* (2013.01); *H01L 29/785* (2013.01); *H01L 21/76802* (2013.01); *H01L 21/76804* (2013.01); *H01L 21/76843* (2013.01)

(56) References Cited

U.S. PATENT DOCUMENTS

| | | |
|---|---|---|
| 6,946,376 B2 | 9/2005 | Chediak et al. |
| 7,741,226 B2 | 6/2010 | Andry et al. |
| 8,455,366 B1 | 6/2013 | Fuller et al. |
| 8,999,779 B2 | 4/2015 | Naczas et al. |
| 9,040,404 B2 | 5/2015 | Ando et al. |
| 9,123,726 B2 | 9/2015 | Filippi et al. |
| 9,219,129 B2 | 12/2015 | Doris et al. |
| 9,252,022 B1 | 2/2016 | Dechene et al. |
| 9,275,901 B1 | 3/2016 | Ok et al. |
| 9,406,616 B2 | 8/2016 | Woo et al. |
| 9,455,186 B2 | 9/2016 | Angyal et al. |
| 9,461,143 B2 | 10/2016 | Pethe et al. |
| 2008/0284029 A1 | 11/2008 | Kim et al. |
| 2013/0146975 A1 | 6/2013 | Cheng et al. |
| 2016/0079238 A1 | 3/2016 | Siemieniec et al. |
| 2016/0099246 A1* | 4/2016 | Basker ............... H01L 27/0924 257/369 |
| 2016/0163644 A1 | 6/2016 | Woo et al. |
| 2018/0233412 A1* | 8/2018 | Xie ................... H01L 29/66795 |
| 2018/0261514 A1 | 9/2018 | Xie et al. |

OTHER PUBLICATIONS

Notice of Allowance with cited art in corresponding U.S. Appl. No. 16/681,038 dated Jun. 14, 2021, 28 pages.

\* cited by examiner

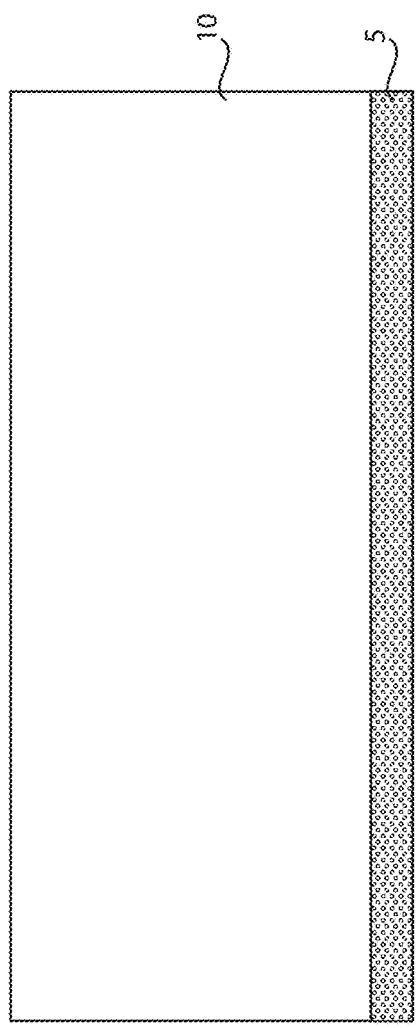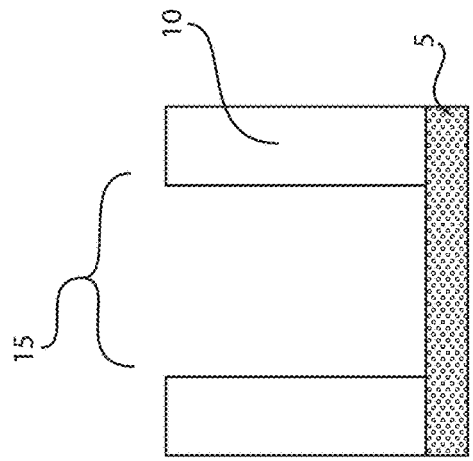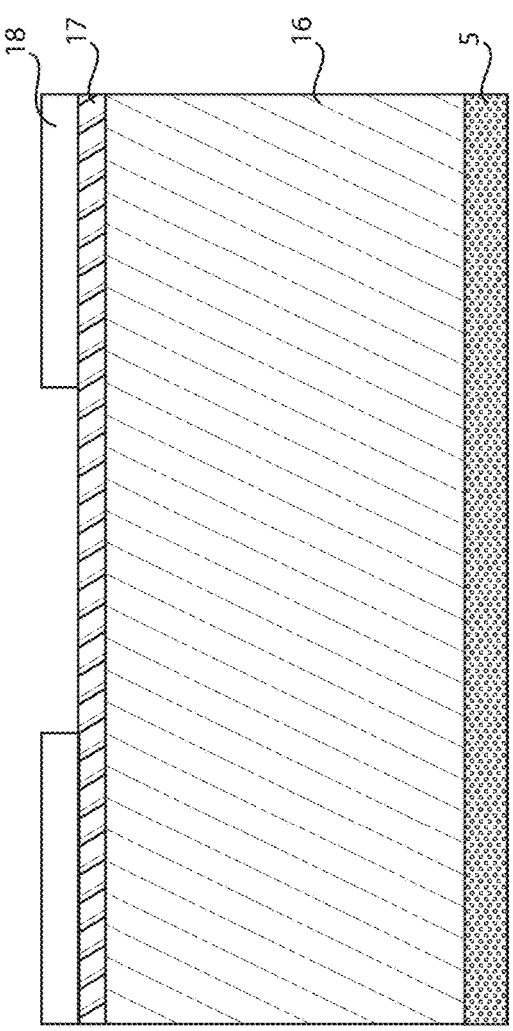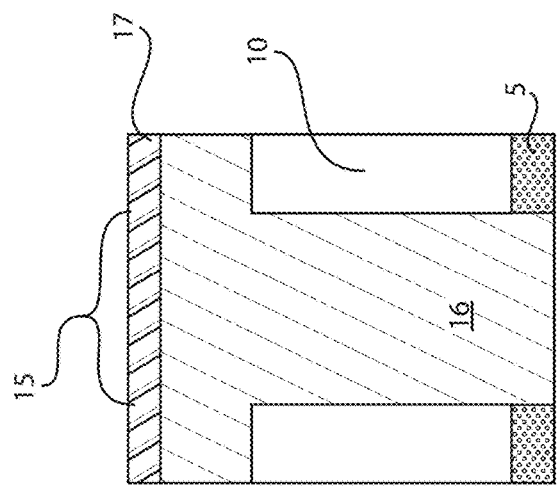

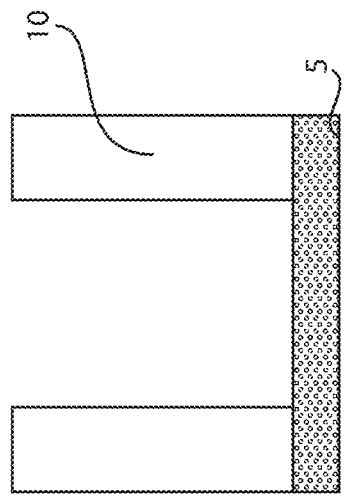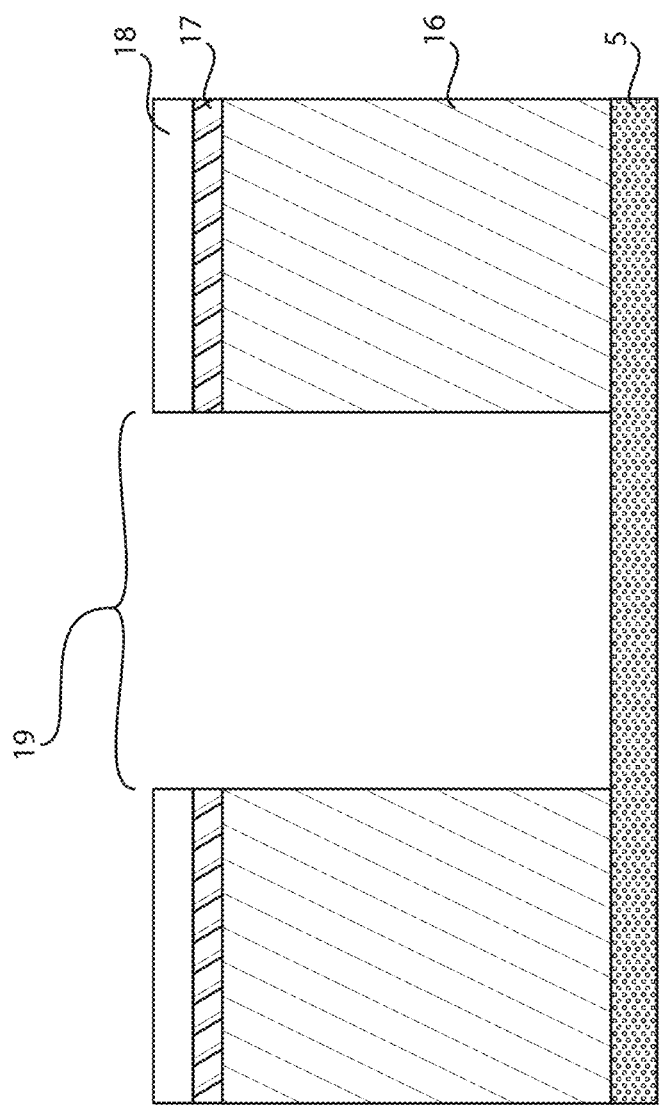

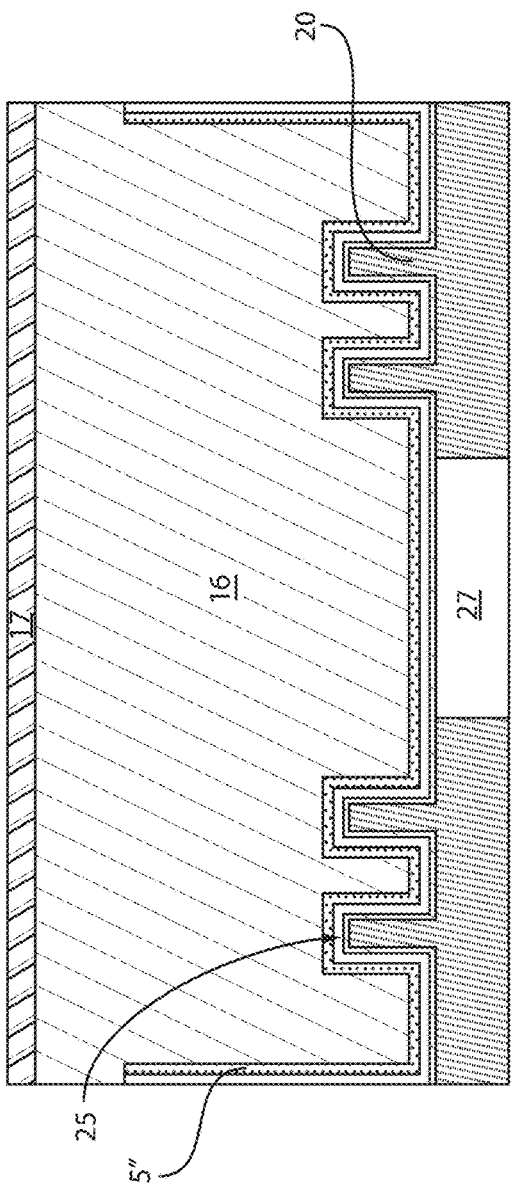
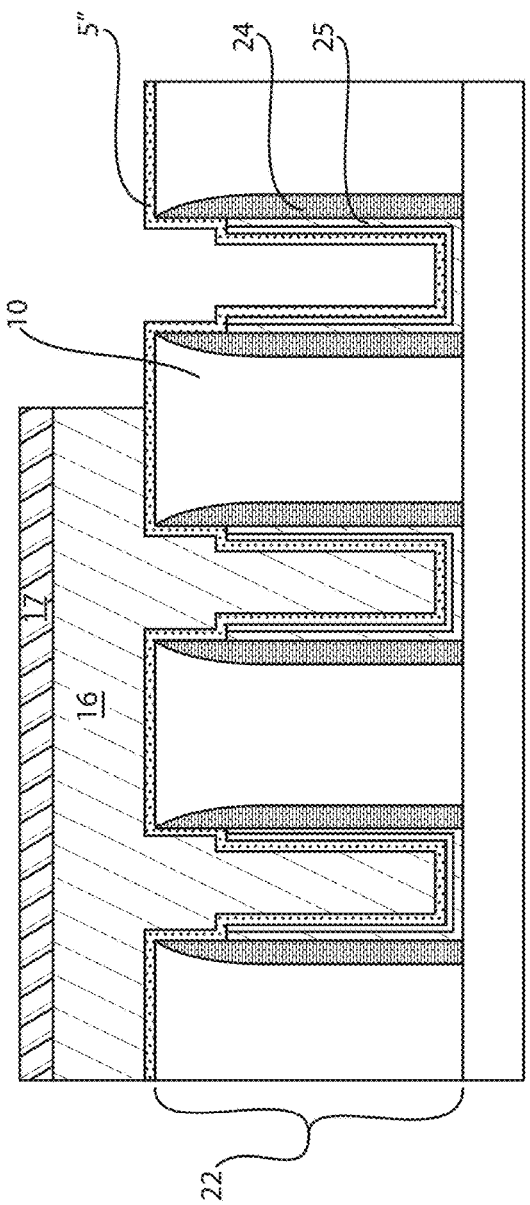
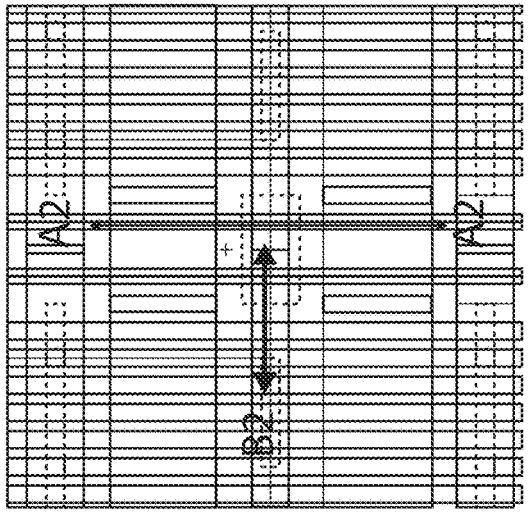
FIG. 5A
FIG. 5B
FIG. 5C

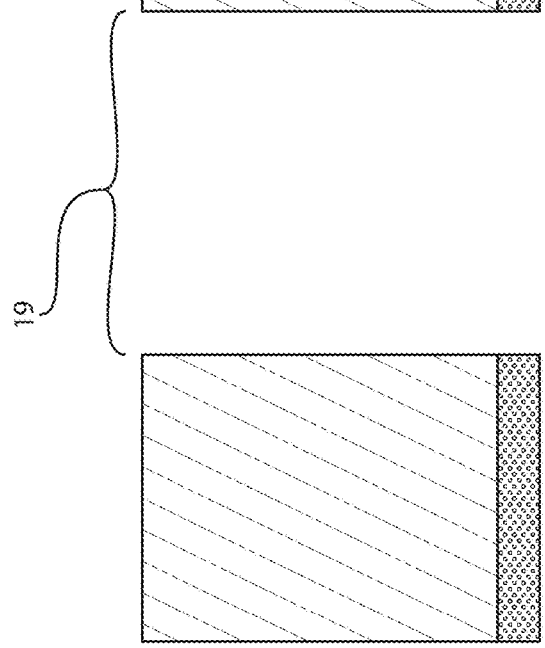
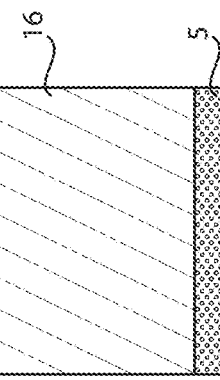
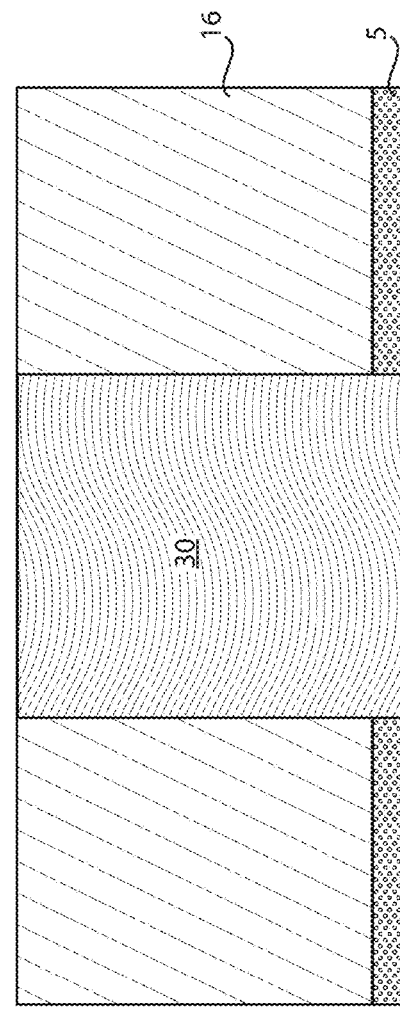

ADDITIVE CORE SUBTRACTIVE LINER FOR METAL CUT ETCH PROCESSES

BACKGROUND

Technical Field

The methods and structures described herein relate to contact structures and gate structures used in semiconductor devices, and methods for forming contact structures and gate structures in semiconductor devices using subtractive etching.

Description of the Related Art

Modern integrated circuits are made up of literally billions of active devices such as transistors. Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Continuing trends in semiconductor device manufacturing include a reduction in electrical device feature size (scaling). With increasing scaling, new processing sequences and methods may be required to avoid shorting of electrical devices when forming interconnects.

SUMMARY

An additive core subtractive liner method is described for forming electrically conductive contacts. The method can include forming a first trench in a first dielectric layer to expose a first portion of a metal liner, and filling said first trench with a second dielectric layer. A metal cut trench is formed in the second dielectric layer. A portion of the metal liner exposed by the metal cut trench is removed with a subtractive method. The method continues with filling the metal cut trench with a dielectric fill, and replacing the remaining portions of the second dielectric layer with an additive core conductor to provide contacts to remaining portions of the metal liner.

In another embodiment, a method of forming contacts to an electrical device is provided that includes forming a metal liner extending from a first region of at least one source/drain region to a second region of at least one source/drain region, and forming at least one dielectric layer over the first and second region. A metal cut is performed to subtractively remove a portion of the metal liner between the first and second regions. The metal cut process forms a tapered metal cut trench in the at least one dielectric layer. A dielectric fill is formed in the metal cut trench. Electrically conductive contacts are formed to the remaining portions of the metal liner on opposing sides of the dielectric fill, wherein the electrically conductive contacts have a lesser width at their upper surface than at their base surface.

In another embodiment, an electrical device is provided that was formed using additive core subtractive liner processing. The electrical device may include a first portion of a metal liner present on a first device feature that is separated from a second portion of the metal liner that is present on a second device feature. The first portion of the metal liner is separated from the second portion of the metal liner substractively. A dielectric fill is present filling the space between the first portion of the metal liner and the second portion of the metal liner. The electrical device further includes electrical contacts on opposing sides of the dielectric fill. The electrical contacts are in electrical communication with the first and second portion of the metal liner.

BRIEF DESCRIPTION OF DRAWINGS

FIG. 1A is a side cross-sectional view depicting one embodiment of an incoming structure for an additive core subtractive liner (ACSL) for metal etch steps along the length of a trench.

FIG. 1B is a side cross-sectional view of the structure depicted in FIG. 1A across the width of the trench.

FIG. 2A is a side cross-sectional view along a length of the trench illustrating one embodiment of depositing an organic planarization layer (OPL) on the structure depicted in FIGS. 1A and 1B; followed by forming a patterning layer, e.g., anti-reflection coating (ARC) or low temperature oxide (LTO) layer; and forming a resist mask.

FIG. 2B is a side cross-sectional view of the structure depicted in FIG. 2A across the width of the trench.

FIG. 3A is a side cross-sectional view along the length of the trench depicting one embodiment of patterning the organic planarization layer (OPL) 16 using the resist mask 18 as an etch mask.

FIG. 3B is a side cross-sectional view of the structure depicted in FIG. 3A across the width of the trench.

FIG. 5A is a top down view of a plurality of FinFETs during a replacement metal gate (RMG) process.

FIG. 5B is a side cross-sectional view along section line A2-A2 of FIG. 5A.

FIG. 5C is a side cross-sectional view along section line B1-B1 of FIG. 5A.

FIG. 6A is a side cross-sectional view along the length of the trench depicting one embodiment of etching the metal liner, i.e., conducting a metal cut, and removing the patterning layer, e.g, ARC or LTO layer, in accordance with one embodiment of the methods and structures described herein.

FIG. 6B is a side cross-sectional view of the structure depicted in FIG. 6A across the width of the trench.

FIG. 7A is a side cross-sectional view along the length of the trench depicting filling the trench including the metal cut with a dielectric fill, in accordance with one embodiment of the methods and structures described herein.

FIG. 7B is a side cross-sectional view of the structure depicted in FIG. 7A across the width of the trench.

FIG. 13A further depicts a selective recess of a core conductor and conductive lines below the top of the self-aligned contact insulator cap.

FIG. 13B further depicts a selective recess of a core conductor and conductive lines below the top of the self-aligned contact insulator cap.

Figure 4A:
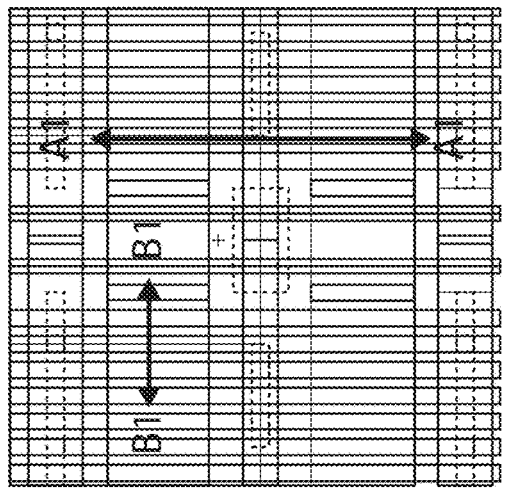
FIG. 4A is a top down view of a plurality of FinFETs during a middle of the line (MOL) process for forming contacts to source and drain regions.

The following description will provide details for some of the preferred embodiments with reference to the following figures wherein:

DETAILED DESCRIPTION OF PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present description. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. As used herein a "field effect transistor" is a transistor in which output current, i.e., source-drain current, is controlled by the voltage applied to the gate. A field effect transistor has three terminals, i.e., gate structure, source region and drain region. A "gate structure" means a structure used to control output current (i.e., flow of carriers in the channel) of a semiconducting device through electrical or magnetic fields. As used herein, the term "channel" is the region underlying the gate structure and between the source and drain of a semiconductor device that becomes conductive when the semiconductor device is turned on. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain.

The etch steps for forming the electrical contacts to the gate structures of semiconductor devices, as well as contacts to the source and drain regions, as well as other active regions and electrical communication structures of electrical devices, can damage adjacent dielectrics, and can result in shorting of adjacent electrical communication structures. For example, during the middle of the line (MOL), the gate contact to source/drain contact spacing design is very aggressive leading to leakage/shorting of the gate structure to the source/drain regions, e.g., in static random access memory (SRAM) logic circuits. In some examples, the dielectric gate cap loss can be severe when subjected to processing for forming contacts to the source and drain regions, which typically includes etching of the interlevel dielectrics (ILD) using anisotropic etches, such as reactive ion etch (RIE). Other processing that can erode the dielectric gate cap) used for self-aligned contact patterning (SAC cap), as well as the adjacent dielectric layers, e.g., interlevel dielectrics (ILDs), can include the planarization steps and recessing steps applied to the electrically conductive materials layers that are deposited within the trenches to form contacts (also referred to as via contacts or interconnects). For example, the planarization steps may include chemical mechanical polishing (CMP), grinding, and polishing of deposited metals, such as tungsten (W). Recess steps may include wet and dry etch processes, e.g., RIE, for recessing the deposited metals, such as tungsten. Each of these steps can result in dielectric loss that can expose electrically conductive surfaces that can result in shorting.

Other difficulties with the middle of the line (MOL) contact scheme include that the discrete multi-color contact patterning involves complex processes containing many lithography masks. The scaling and proximity of the gate contact to source/drain contact spacing required for dense SRAM circuits is another issue in increasing scaled integrated circuits. For example, the gate contact is typically too close to the source contact and/or drain contact, which can result in the formation of a short. Increasing the separation of these structures is also not an option, because increasing the separation can create a penalty on the contact area of the end of the Fin/Epi, which would increase contact resistance. In some embodiments, to overcome this deficiency a tapered contact sidewall is employed that maintains contact area while increasing separation between the middle of the line (MOL) contacts. The merged contact metal cut process can solve the problems with the decreased spacing between the gate contact and the source and drain contacts by utilizing a tapered contact sidewall that maintains contact area while increasing separation between the middle of the line (MOL) contacts. "Self-aligned contact" reactive ion etch (RIE) of the interlevel dielectric layer erodes the SAC cap, i.e., the cap dielectric atop the gate structure, in which the SAC cap may be further eroded by contact pre-cleans, metal fill chemical mechanical planarization (CMP), CMP buffing, and similar material removal processes. As will be further described below, the methods and structures of the present disclosure can overcome the aforementioned difficulties with a merged source/drain contact cut process flow that implements several metal recess steps and fill techniques to preserve SAC cap, prevent pinch-off during bulk metal fill, and offers a "bottom-up" fill approach when utilizing cobalt (Co) metallization.

In some embodiments, the methods and structures described herein overcome the above difficulties with the source/drain contact etch steps by utilizing a merged contact deposition and cut scheme instead of the conventional discrete patterning steps of the contact formation process to source and drain epitaxy. This process may be referred to as additive core subtractive liner (ASCL) processing. More specifically, a metal liner extending between adjacent groupings of source/drain regions is cut, i.e., removed by etch, at a portion between the groupings of fin structures, wherein a portion of the metal liner remains on the source/drain regions of each grouping. The etch process provides a metal cut trench that is filled with a dielectric fill separating the adjacent groupings of source/drain regions. Thereafter, electrically conductive contacts are formed by additive core processing to the remaining portions of the metal liner that is present on the source and drain regions on opposing sides of the dielectric fill.

The merged SAC process reduces the requirements of mask count for contact patterning vs. discrete SAC. This also minimizes the unwanted SAC cap erosion during the contact reactive ion etch (RIE) steps, chemical mechanical planarization (CMP) for the metal contacts, and the buff CMP steps.

In some embodiments, a contact "cut" patterning is completed which provides a tapered sidewall profile to cover end epitaxial semiconductor material and provide increased spacing between the gate structure and the source/drain contact. Additionally, a selective organic planarization layer (OPL) and contact liner recess step removes shorting between devices. The methods also disclose a selective tungsten (W) or cobalt (Co) bulk metal fill etch that is used to recess the bulk metal below the top of the SAC cap to electrically isolate source/drain contacts without chemical mechanical planarization (CMP) steps that erode the SAC cap. Contact etching to the cut contacts on source/drain regions does not etch into the SAC cap/spacers and the threat of shorting to the gate is drastically minimized.

Selective organic planarization liner (OPL) and metal liner recess minimizes the threat of bulk metal pinch-off during deposition at the top of the gate sidewall. This also allows for a "bottom up", seamless/voidless fill process when using a cobalt (Co) seed and cobalt (Co) plating technique. Further, the selective tungsten (W) or cobalt (Co) wet recess technology added to this process flow prevents any SAC cap and erosion from metal chemical mechanical planarization (CMP) and metal buff CMP to preserve the SAC cap and minimize source/drain to gate shorting. The methods disclosed herein for the merged source/drain contact liner cut may be used for contact fill up to the middle-of-line (MOL) level without the need for separate etch process sequences for forming the contacts to the source region, drain region and/or gate region The method above may allow for a continuous bulk core conductor without any Ti/TiN interface between contact levels in the front-end-of-line (FEOL) to improve vertical resistance and to reduce signal delay of the interconnects.

The patterning of the gate, i.e., gate cut, past the active portion of the end fin can be a critical obstacle for SRAM circuit manufacturing. In some instances, aggressive replacement gate processing past the end fin can lead to residual silicon (Si) during removal of the replacement gate structure, e.g., polysilicon pull. In some scenarios, multiple threshold voltage (multi-Vt) work function metal (WFM) thickness differences in p-type field effect transistors (PFET)/n-type field effect transistors (NFET) limits the work function metal coverage at the end of the fin and electrostatic control of the channel which can result in increased leakage and Ron.

In some embodiment, the gate cut formed in the polysilicon replacement gate structure results in significant gate height losses and variation in gate height. A loss of interlevel dielectric layer (ILD) material in the gate cut region can result in the formation of an etch stop plug within the gate cut region after dielectric fill preventing local source to drain interconnect formation or metal containing puddles downstream of the polysilicon replacement gate removal process sequence causing a short. In some instances, gate cut prior to forming the replacement metal gate (RMG) results in a defined gate tip to tip spacing, which can be a scaling issue. The replacement gate conductor extension past the active region of a fin structure, in highly scaled SRAM/logic circuits limits high-k and work function metal (WFM) coverage, which can result in incomplete gate control over the end fin. Further, residual amorphous silicon ($\alpha$-Si) can get trapped in the gate extension past the active end fin prior to RMG, which can be very hard to remove during both the dummy polysilicon pull and the reliability silicon liner strip after reliability anneal.

In some embodiments, the methods and structures described herein overcome the above difficulties with the etch steps to cut a gate structure (gate cut) in replacement metal gate (RMG) processing. For example, the methods and structures disclosed herein provide for minimized gate extending past the end of the active fin in static random access memory (SRAM) logic devices with complete work function metal coverage of the end fin. Further, the methods and structures disclosed herein may perform a gate cut process that has no residual poly issues due to continuous lines during silicon strips. Additionally, the methods and structures disclosed herein for performing etch steps to cut a gate structure (gate cut) in replacement metal gate (RMG) processing allows for multiple threshold voltage (multi-Vt) replacement metal gate processes in tight gate cuts past the end of the active fin, i.e., tight gate tip to tip dimensions. In some embodiments, the method employs a gate cut step in the replacement metal gate (RMG) module, i.e., process flow, instead of forming the gate cut in the dummy gate conductor. In some embodiments, the work function metal (WFM) is deposited and cut using an additive core subtractive liner (ACSL) method that is similar to the additive core subtractive liner (ACSL) method that is described above for the source/drain contact cut process. For example, the work function metal (WFM) is etched to provide the gate cut, and a dielectric fill, e.g., silicon nitride, fills the gate cut trench. In some embodiments, a thin titanium nitride (TiN) layer and tungsten (W) fill is completed by additive core processing, i.e., the formation of an additive conductor core (which may include a TiN layer and W fill) after the organic planarization layer (OPL) ash, i.e., OPL removal. In yet other embodiments, fluorine free tungsten (FFW) may be used as well for the direct fill that provides the additive conductive core. In yet another embodiment, the additive conductive core may be composed of cobalt (Co).

It is noted that the aforementioned source and drain contact etch processes, and the gate cut in replacement metal gate (RMG) processing, are only some examples of processes that are suitable for the disclosed additive core subtractive liner (ACSL) process described herein. The ACSL process may be equally applicable to back end of the line (BEOL) processes, such as the formation of interconnects. The method and structures for employing an additive core subtractive liner (ACSL) methods are now described in more detail with reference to FIGS. 1A-14.

The additive core subtractive liner (ACSL) process for metal cuts provides an alternative source/drain contact scheme, in which a merged contact and cut/recess process flow minimizes SAC cap (i.e., dielectric cap, e.g., silicon nitride cap, atop gate structure) erosion. The ACSL process does not use a discrete SAC process flow, in which it has been determined that the typical SAC process flow disadvantageously removes the SAC dielectric material through its multiple subtractive material removal steps, e.g., inter-level dielectric (ILD) reactive ion etch (RIE), and contact clean, as well as several metal chemical mechanical planarization (CMP) steps. The additive core subtractive liner (ACSL) process for metal cuts also provides for merged contact formation and subsequent cut processes to electrically isolate liner shorting between devices. In some embodiments, a tapered organic planarization layer (OPL) profile may be used to maximize contact area while increasing the gate to source/drain contact separation in highly scaled SRAM layouts. The additive core subtractive liner (ACSL) process also provides a selective organic planarization layer (OPL) recess and titanium (Ti)/titanium nitride (TiN) (or Ti/TiN and Co seed) wet etch to remove shorting between PCs (gate structures). In some embodiments, the disclosed methods increase the space for the metal fill while minimizing the threat of pinch off/void formation. The additive core subtractive liner (ACSL) process can also provide a selective tungsten (W)/cobalt (Co) recess after metallization to avoid buff chemical mechanical planarization (CMP) that is required of prior methods. The selective tungsten (W)/cobalt (Co) recess can remove source (S)/drain (D) shorts by recessing the metal below the top of the SAC cap. The additive core subtractive liner (ACSL) process can preserve the maximum thickness of the SAC cap to prevent shorting between the contact to the gate structure (CA) and the contacts to the source region and drain region (CC, CE) of a semiconductor device.

FIGS. 1A and 1B depict one embodiment of an incoming structure for an additive core subtractive liner (ACSL) for metal etch steps, also referred to as metal cuts. In the embodiments depicted in FIGS. 1A and 1B, the metal liner 5 can be a source/drain contact liner, a gate work function metal (WFM), or a back end of the line (BEOL) interconnect liner. In some embodiments, a trench 15 may be formed through a dielectric layer 10 that is positioned on the metal liner 5.

The metal liner 5 may be composed of any metal. For example, the metal liner 5 may be composed of tungsten (W), titanium (Ti), tantalum (Ta), copper (Cu), platinum (Pt), silver (Ag), gold (Au), cobalt (Co) and combinations thereof. The metal liner 5 may also be composed of a metal nitride, such as a metal nitride including one of the aforementioned metals, e.g., titanium nitride (TiN). In some embodiments, the metal liner 5 may be a single material layer, or the metal liner 5 may be composed of a stack of multiple layers. For example, the metal liner 5 may be the combination of the titanium nitride (TiN) layer, and a Cobalt seed metal layer. It is noted that the metal liner 5 is not limited to only the aforementioned materials, as any electrically conductive material may be employed in the metal liner 5 so long as the material selected is consistent with the following process flow. "Electrically conductive" as used through the present disclosure means a material typically having a room temperature conductivity of greater than $10^{-8}$ $(\Omega \cdot m)^{-1}$.

As noted above, in some embodiments, the metal liner 5 may provide a work function metal (WFM). The work function metal may be a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of titanium nitride (TiN). In another embodiment, the n-type work function metal layer is composed of at least one of TiAl, TanN, HfN, HfSi, or combinations thereof.

The metal liner 5 may be formed using a deposition process, such as chemical vapor deposition, e.g., plasma enhanced chemical vapor deposition (PECVD); physical vapor deposition (PVD), e.g., sputtering; or plating, e.g., electroplating and/or electroless plating.

Although not depicted in FIGS. 1A and 1B, in some embodiments, when the structure depicted in FIGS. 1A and 1B is the incoming structure for a process flow for providing a gate cut for replacement metal gate (RMG) processing, the metal liner 5 may be formed on a high-k dielectric covering the active semiconductor channel. In some embodiments, when the metal liner 5 is a conductive feature to the source and drain regions of a contact trench, a portion of the metal liner 5 may be in contact with source and/or drain region of a semiconductor device, e.g., the source and drain region of a fin structure to a FinFET.

The dielectric layer 10 may be composed of any electrically insulating material. For example, typical dielectric materials used for interlevel dielectrics and intralevel dielectrics in microelectronics may be suitable for the dielectric layer, such as oxides, nitrides and oxynitrides. In some embodiments, the dielectric layer 10 may be an oxide layer, such as silicon oxide. In other embodiment, the dielectric layer 10 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H).

The trench 15 may be formed in the dielectric layer 10 using deposition, photolithography and etch processing, e.g., reactive ion etching (RIE). The trench 15 may also be a selective wet or dry etch process to remove ILD between gates. The trench 15 exposes a portion of the metal liner 5.

FIGS. 2A and 2B illustrate one embodiment of depositing an organic planarization layer (OPL) on the structure depicted in FIGS. 1A and 1B; followed by forming a patterning layer 17, e.g., anti-reflection coating (ARC) or low temperature oxide (LTO) layer; and forming a resist mask 18. The organic planarization layer (OPL) layer 16 may be composed of an organic polymer that may include polyacrylate resin, epoxy resin, phenol resin, polyamide resin, polyimide resin, unsaturated polyester resin, polyphenylenether resin, polyphenylenesulfide resin, or benzocyclobutene (BCB). The OPL layer should be baked at a temperature at or above the subsequent processing steps to ensure no out-gassing and contamination. In some embodiments, the organic planarization layer (OPL) 16 is deposited from solution, e.g., by spin on deposition, and is baked at high temperature. The organic planarization layer (OPL) 16 typically fills the trench 15, and can extend atop the upper surfaces of the dielectric layer, as depicted in FIGS. 2A and 2B. In one embodiment, the patterning layer 17 can be a low temperature oxide, e.g., silicon oxide ($SiO_2$), deposited by chemical vapor deposition (CVD) at temperatures of less than 400° C., which can be selectively lied over the metal liner 5 after patterning. In another embodiment, the patterning layer 17 can be an anti-reflective coating (ARC) composed of silicon oxynitride (SiON) that is deposited using chemical vapor deposition (CVD), such as plasma enhanced chemical vapor deposition (PECVD) or low temperature chemical vapor deposition in yet another embodiment, the patterning layer 17 can be an anti-reflective coating (ARC) composed of titanium (Ti). In some embodiments, when the patterning layer 17 is an ARC layer composed of the titanium (Ti) the wet etch processes that etch the metal liner 5", 5', 5" may also remove, i.e., via etch, the patterning layer 17.

In a following process step, a resist mask 18 is formed atop the patterning layer 17. The resist mask 18 may be patterned to define the cut region of the metal liner 5. The resist mask 18 may be formed using deposition, photolithography and development processes. Specifically, and in one example, the resist mask 18 is produced by applying a photoresist layer to the patterning layer 17, exposing the photoresist layer to a pattern of radiation, and then developing the pattern into the photoresist utilizing a resist developer.

FIGS. 3A and 3B depict one embodiment of patterning the organic planarization layer (OPL) 16 (which may be referred to as cut patterning of the OPL) using the resist mask 18 as an etch mask. In some embodiments, patterning the organic planarization layer (OPL) 16 may include an etch that terminates, i.e., stops, on the metal liner 5. Patterning the organic planarization layer (OPL) 16 may include an etch process that is selective to the metal liner 5. For example, once the patterning of the resist mask 18 is completed, the sections of the patterning layer 17 and the OPL layer 16 covered by the resist mask 18 are protected, while the exposed regions are removed using a selective etching process. The term "selective" denotes that a first material may be etched at a faster rate to a second material. For example, the selective etch rate may remove a first material at a rate greater than 20:1, e.g., greater than 100:1, in comparison to a second material.

The etch process for removing the portion of the patterning layer 17 and the organic planarization layer (OPL) 16 exposed by the resist mask 18 may be reactive ion etch (RIE), which can be selective to metal liner 5. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface.

The etch process for removing the portion of the patterning layer 17 and the organic planarization layer (OPL) 16 that is exposed by the resist mask 18 can provide a metal cut trench 19.

Figure 4B:
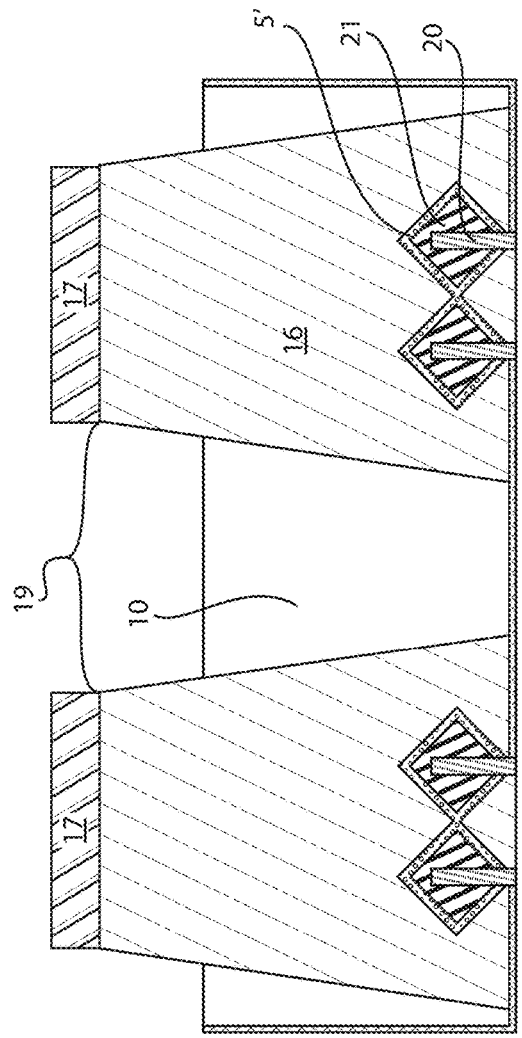
FIG. 4B is a side cross-sectional view along section line A1-A1 of FIG. 4A.
Figure 4C:
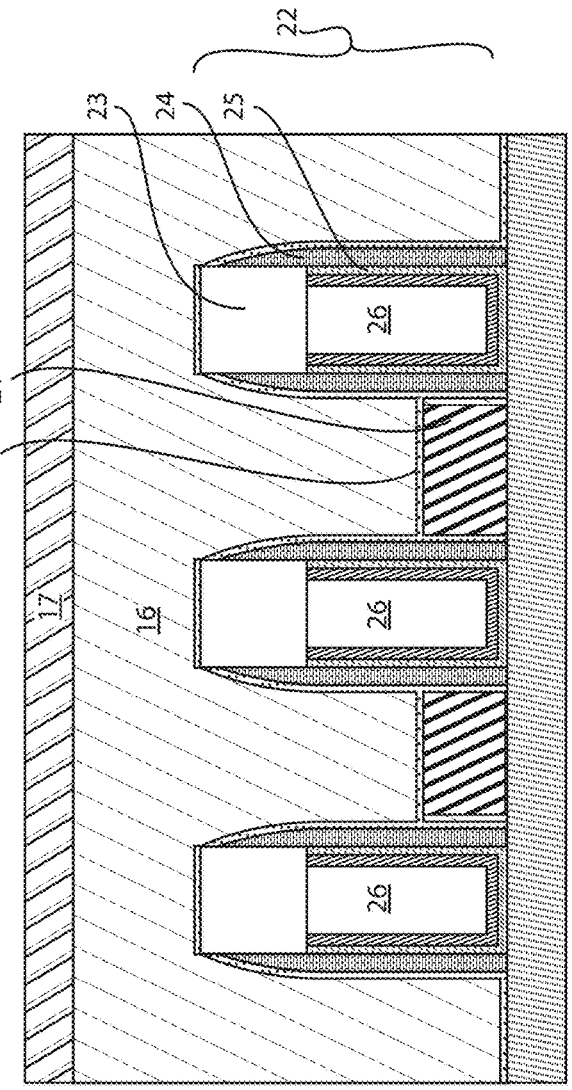
FIG. 4C is a side cross-sectional view along section line B1-B1 of FIG. 4A.

As noted above, in some embodiments, when the additive core subtractive liner (ACSL) process is employed in a middle of the line (MOL) source/drain contact formation process, the etch process for forming the metal cut trench 19 may provide a taper in the organic planarization layer (OPL) 16' sidewall profile, as depicted in FIGS. 4A-4C. FIGS. 4A-4C illustrate a plurality of fin structures 20 in two groups. Each group of fin structures 20 includes an epitaxial semiconductor material, e.g., in-situ doped with n-type or p-type dopant, which may be formed on the fin portions of the fin structures 20. Although each group of fin structure 20 includes two fin structures 20, the present disclosure is not limited to on this example, as any number of fin structures 20 can be included in each grouping. Although the epitaxial semiconductor material 21 is depicted as being individually formed for each fin structure 20, the epitaxial semiconductor material 21 may also be formed merging adjacent fin structures 20 in each grouping of fin structures 20. In FIGS. 4A-4C the structures having reference numbers 10, 16 and 17 have been described above with reference to FIGS. 1A-3B.

Referring to FIGS. 4A-4C, the metal liner 5' may be present on the exterior surfaces of the epitaxial semiconductor material 21 that is present on the source and drain portions of the fin structures 20. The metal liner 5' that is depicted in FIGS. 4A-4C is similar to the metal liner 5 that has been described with reference to FIGS. 1A-3B. Therefore, the above description of the composition and method of forming the metal liner 5 depicted in FIGS. 1A-3B is suitable for the metal liner 5' depicted in FIGS. 4A-4C. The metal liner 5' may be a conformal layer that is present on each fin structure 20, i.e., on each epitaxial semiconductor material 21 of reach fin structure 20, and continuously extends between each grouping of fin structures 20.

FIG. 4C illustrates a plurality of gate structures 22 present on the fin structures 20. Each gate structure 22 may include a SAC cap 23, e.g., a silicon nitride cap; at least one gate dielectric 25; e.g., a high-k gate dielectric, such as hafnium oxide; and a gate conductor 26, such as a metal gate conductor, a work function metal containing gate conductor or a doped polysilicon gate conductor. Gate sidewall spacers 24 may be present on the sidewalls of the gate structure 22. The gate structures 22 depicted in FIG. 4C may be functional gate structures formed using a gate first process, or in other embodiments, the gate structures 22 may be sacrificial gate structures employed in a gate last process flow, such as a replacement metal gate (RMG) process flow. In some embodiments, the metal liner 5' is deposited on the gates as well, as is shown in the supplied figures, wherein the metal liner 5' will be recessed with the selective etches later in the process flow.

Referring to FIGS. 4A-4C, the additive core subtractive liner (ACSL) process employed in the middle of the line (MOL) source/drain contact formation process can employ an etch process for forming the metal cut trench 19 that includes a taper in the organic planarization layer (OPL) 16 sidewall profile. In some embodiments, the taper in the organic planarization layer (OPL) 16 sidewall profile can range from 2° to 10°. In other embodiments, the taper in the organic planarization layer (OPL) 16 sidewall profile can range from 2° to 5°. To provide the taper, an anisotropic etch may be employed with an adjustment made to provide for a degree of angled etching. For example, the etch process may be reactive ion etch (RIE) or a plasma etch, in which an additive, such as a polymeric additive, may be added to the dry etch species to provide the taper. In other embodiments, an isotropic etch gas may be employed to provide the taper in the sidewalls of the metal cut trench. It is noted, that the tapered sidewall is only one embodiment of a process flow for a middle of the line (MOL) contact to the source/drain regions, and is not requirement of all process sequences that employ additive core subtractive liner (ACSL) processing.

FIGS. 5A-5C illustrate one embodiment of a step for an additive core subtractive liner (ACSL) process employed during a replacement metal gate (RMG) process. The incoming structure for the RMG process employing ACSL processing may be after the sacrificial gate structure is removed, i.e., after dummy polysilicon pull and after the gate dielectrics 25, e.g., high-k gate dielectric, such as hafnium oxide ($HfO_2$), have been deposited on the channel region of the fin structures 20. In some embodiments, the ACSL processing may occur after the work function metal (WFM) is formed on the gate dielectrics 25. The ACSL processing may also begin after the formation of the source and drain regions for the device for both gate cut and source/drain contact cut. In FIGS. 5A-5C the structures having reference numbers 10, 16 and 17 have been described above with reference to FIGS. 1A-3B. The structure identified by reference number 24 is a gate sidewall spacer. The structure identified by reference number 27 is an isolation region separating adjacent groups of fin structures 20.

In FIGS. 5A-5C, the metal liner 5" is formed over the gate dielectrics 25 in gate opening that is formed by removing the sacrificial gate structure as part of the replacement metal gate process flow. The metal liner 5" that is depicted in FIGS. 5A-5C is similar to the metal liner 5 that has been described with reference to FIGS. 1A-3B. Therefore, the above description of the composition and method of forming the metal liner 5 depicted in FIGS. 1A-3B is suitable for the metal liner 5" depicted in FIGS. 4A-4C. The metal liner 5" is also formed over the portions of the interlevel dielectric 10 that is separating adjacent gate openings.

The organic planarization layer (OPL) 16 and patterning layer 17 are deposited over the gate openings, in which the gate openings are filled with the organic planarization layer 16. Similar to the process described with reference to FIGS. 3A and 3B, the organic planarization layer 16 and the patterning layer 17 are patterned, i.e., etched, to expose the portion of the metal liner 5" that is to be etched by the metal cut. In the embodiment depicted in FIG. 5C, one of the gate openings is exposed and the organic planarization layer (16) is removed therefrom to expose the underlying metal liner 5", wherein the remaining gate openings are protected by a photoresist mask and the remaining portion of the patterning layer 17/organic planarization layer (OPL) 16.

FIGS. 6A and 6B depict one embodiment of etching the metal liner 5, i.e., conducting a metal cut. This portion of the process flow may be referred to as the subtractive liner portion of the additive core subtractive liner (ACSL) process flow. Etching the metal liner 5 may begin with removing the resist mask 18 and the remaining portions of the patterning layer 17. The resist mask 18 and patterning layer 17 may be removed using selective etching, e.g., a wet etch that removes the resist mask 18 and patterning layer 17 without removing the organic planarization layer 16 or the metal liner 5. In the embodiments in which the patterning layer 17 can be an anti-reflective coating (ARC) composed of titanium (Ti), the patterning layer 17 can be removed by wet etch processes that etch the metal liner 5, 5', 5", as will be described below. In the embodiments where the layer 17 can be silicon dioxide, the patterning layer 17 can be selectively removed over the metal liner 5, 5', 5" using a buffered hydrofluoric acid etch.

The exposed portion of the metal liner 5 may then be removed by an etch process that is selective to at least the organic planarization layer (OPL) 16. In some embodiments, the etch process may be provided by a wet chemical etch. For example, when the metal liner 5 is composed of at least one of tungsten (W), cobalt (Co), titanium (Ti) and titanium nitride (TiN), the metal liner 5 may be removed selectively to dielectrics, such as silicon oxide (as used in interlevel dielectrics), silicon nitrides (as used in gate structure caps (SAC cap), and silicon boron carbon nitride (SiCBN) (as used in gate sidewall spacers). Therefore, cutting the metal liner 5 can avoid eroding the gate cap (SAC cap), the interlevel dielectrics (ILD) and the gate sidewall spacers, which can substantially reduce the incidence of shorting, e.g., shorting to gate structures.

In some embodiments, the wet etch for etching, i.e., cutting, the exposed portion of the metal liner 5 may be provided by an SC-1 etch composition. In one example, SC-1 includes of a mixture of ammonium hydroxide and hydrogen peroxide and deionized water. A typical concentration ratio for the mix is 1:1:5 $NH_4OH:H_2O_2:H_2O$, although ratios as low as 0.05:1:5 are suitable for cleaning the substrate 5. SC-1 typically operates in a temperature ranging from 50° C. to 70° C.

In some other embodiments, the wet etch for etching, i.e., cutting, the exposed portion of the metal liner 5 may be provided by an SC-2 etch composition. In one example, SC-2 includes a mixture of hydrochloric acid, hydrogen peroxide, and deionized water. A typical concentration ratio for the mix is 1:1:5 HCl:H2O2:H2O. SC-2 is typically operated in the temperature range of 50–70° C.

In some other embodiments, the wet etch for etching, i.e., cutting, the exposed portion of the metal liner 5 may be sulfuric peroxide, e.g., ultra dilute sulfuric peroxide (UDSP).

It is noted that the above examples are only some examples of etch compositions that are suitable for use with the methods and structures described herein. In other embodiments, the etch process for removing the exposed portion of the metal liner 5, or additional metal containing layers accompanying the metal liner 5, may be reactive ion etch (RIE). In one example, the exposed portion of the metal liner 5, 5', 5" may be etched using at atomic layer etch process.

In some examples, the metal liner 5, 5', 5" can be preferentially etched in the vertical and that horizontal direction that is perpendicular to the trench sidewall of the metal cut trench to maintain the required cut dimensions without increasing the cut size during etch. In some examples, directionality can be obtained by implanting chemical species that increase the conductive liner etch rate. The chemical species that increases the metal liner 5, 5', 5" etch directionality and etch rate may include at least one of an implanted species of oxygen; an implanted species of a halogen; an implanted species of a noble gas atom; an implanted species of nitrogen; and a combination thereof. In some examples, the implant beam is continuously varied in angle of incidence to reach the sidewalls and bottom of the metal liner 5, 5', 5". In some examples, the energy of the implanted beam is chosen as to not penetrate into the interlevel dielectric layer 10 sufficiently stopped by the organic planarization layer 16 as to protect the underlying conductive liners to prevent damage. The conductive liners, i.e., metal liner 5, 5', 5" after beam line processing can be removed with wet etch chemistries similar to ammonium hydroxide, hydrochloric acid, ultra-dilute sulfuric acid, can combinations thereof.

FIGS. 7A and 7B depict filling the trench 19 including the metal cut with dielectric 30 that provides a conformal dielectric fill. In some examples, the dielectric 30 that provides the dielectric fill is a nitride. Silicon nitride is one example of dielectric 30 that is suitable for the conformal dielectric fill of high aspect ratio structures. This dielectric fill temperature should be at or below the temperature used for OPL baking after OPL deposition. A SiN cap can then be deposited on the surface to help fill larger sized trenches that are not pinch-off by the liner and to help with planarization. It is noted that other dielectric materials may also be used for the dielectric 30 that provides the dielectric fill, so long as the organic planarization layer 16 can be removed selective to the dielectric 30 that provides the dielectric fill. It is also noted that the dielectric 30 selected for providing the dielectric fill in some embodiments may be selected so that subsequently formed metal contacts, e.g., metal contact to the source/drain of a middle of the line (MOL) source/drain contact process, gate conductor/gate conductor contact in a replacement metal gate (RMG) process, or contact in a back end of the line (BEOL) interconnect, can be recessed by a selective etch that does not remove the dielectric fill within the gate cut trench.

Examples of dielectrics 30 that can be used for the dielectric fill may be selected from the group consisting of diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ), methylsilsesquioxane (MSQ), silicon boron carbon nitride (SiBCN), aluminum oxide, hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), lanthanum aluminate ($LaAlO_3$), zirconium silicate ($ZrSiO_x$) and combinations thereof.

The dielectric 30 for the dielectric fill is deposited to fill the entirety of the metal cut trench 19. The dielectric 30 for the dielectric fill is typically deposited using a low temperature process. By "low temperature" it is meant that the temperature of the deposition process does not exceed 500° C. In some embodiments, the maximum temperature of the low temperature deposition process for forming the dielectric 30 that provides the dielectric fill is equal to 400° C. or less. For example, the temperature of the deposition process for forming the dielectric 30 for the dielectric fill ranges from 25° C. to 400° C. In some examples, the dielectric layer 30 may be formed by a deposition process having a maximum temperature ranging from 25° C. to 300° C.

In one embodiment, the dielectric 30 for the dielectric fill is formed using atomic layer deposition (ALD), e.g., plasma enhanced atomic layer deposition (PEALD). In other embodiment, the dielectric 30 for the dielectric fill may be deposited using a chemical vapor deposition (CVD) process, such as plasma enhanced chemical vapor deposition (PECVD), metal organic chemical vapor deposition (MOCVD) and/or low temperature chemical vapor deposition (LTCVD).

Figure 8A:
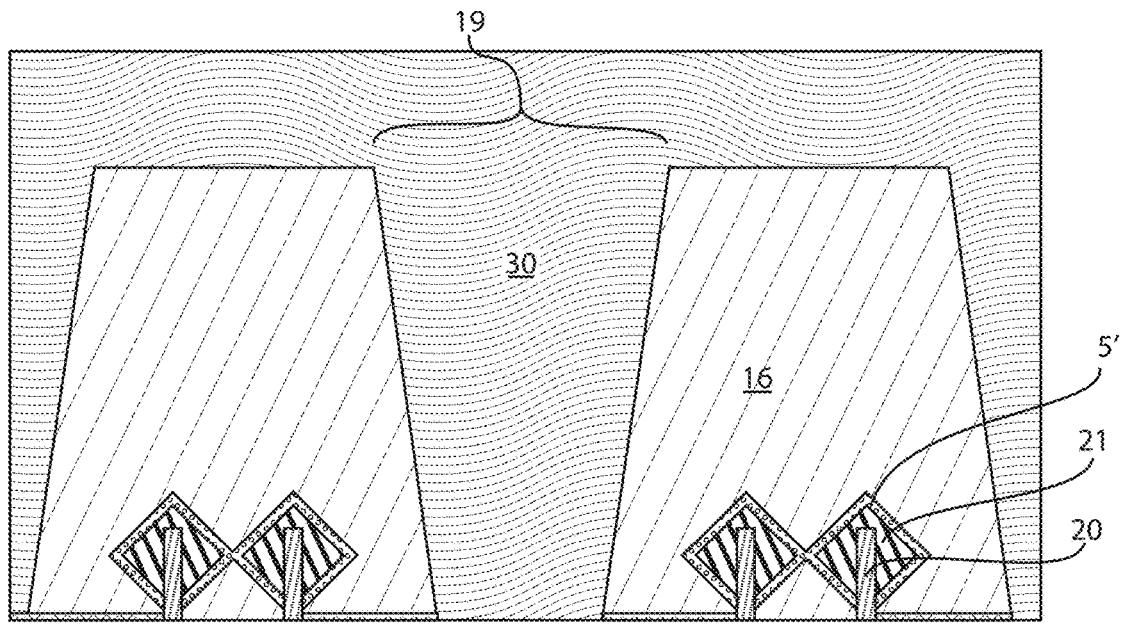
FIG. 8A is a side cross-sectional view illustrating forming a dielectric fill in a metal cut trench formed in a middle of the line (MOL) process for forming contacts to source and drain regions, as depicted in FIG. 4B.
Figure 8B:
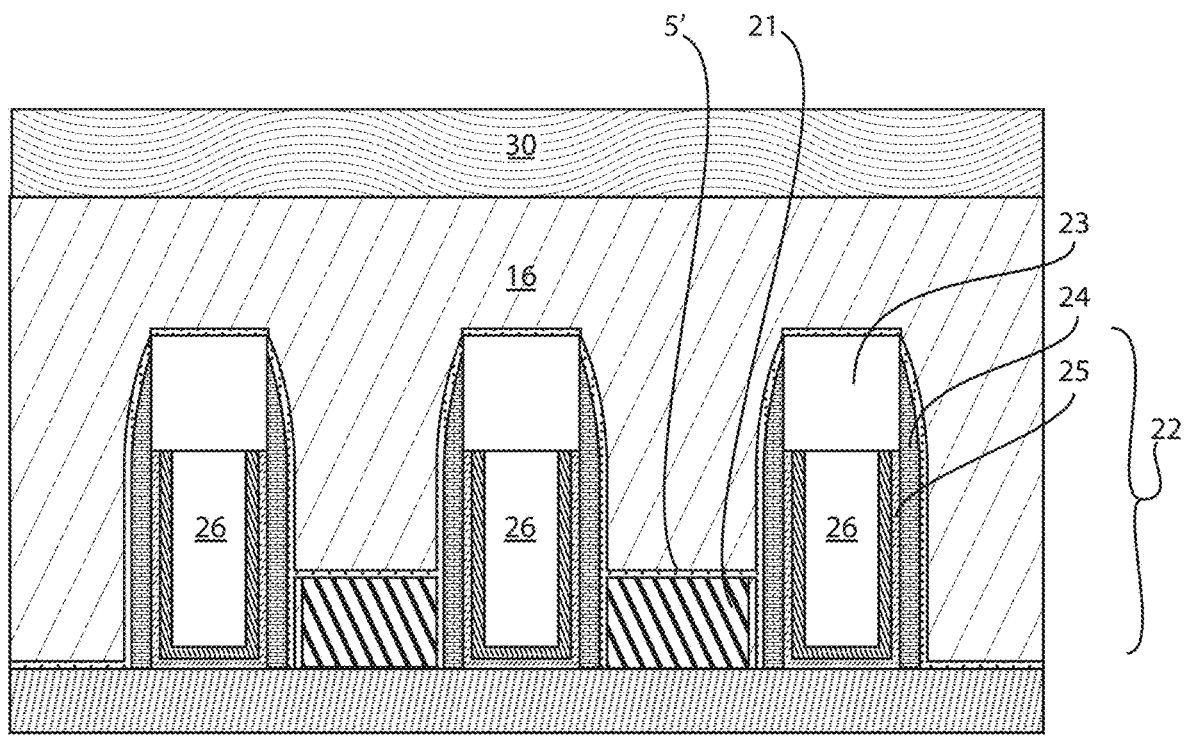
FIG. 8B is a side cross-sectional view illustrating forming a dielectric fill in the metal cut trench depicted in FIG. 4C.

FIGS. 8A and 8B depict forming a dielectric 30 for the dielectric fill in metal cut trench 19 formed in a middle of the line (MOL) process for forming contacts to source and drain regions, i.e., the epitaxial semiconductor material 21 present on the source and drain region portions of the fin structure 20, as depicted in FIG. 4B. Prior to forming the dielectric 30, the exposed portion of the metal liner 5' that is present in the metal cut trench 19 may be removed. The process for removing the exposed portion of the metal liner 5' is similar to the process described above with reference to FIGS. 6A and 6B for removing the exposed portion of the metal liner 5.

Referring to FIGS. 8A and 8B, in some embodiments, the dielectric 30 may be deposited to fill an entirety between the gate structures with some overburden cap, in the case in which the additive core subtractive liner (ACSL) process is applied to forming contacts to source and drain regions.

Figure 9A:
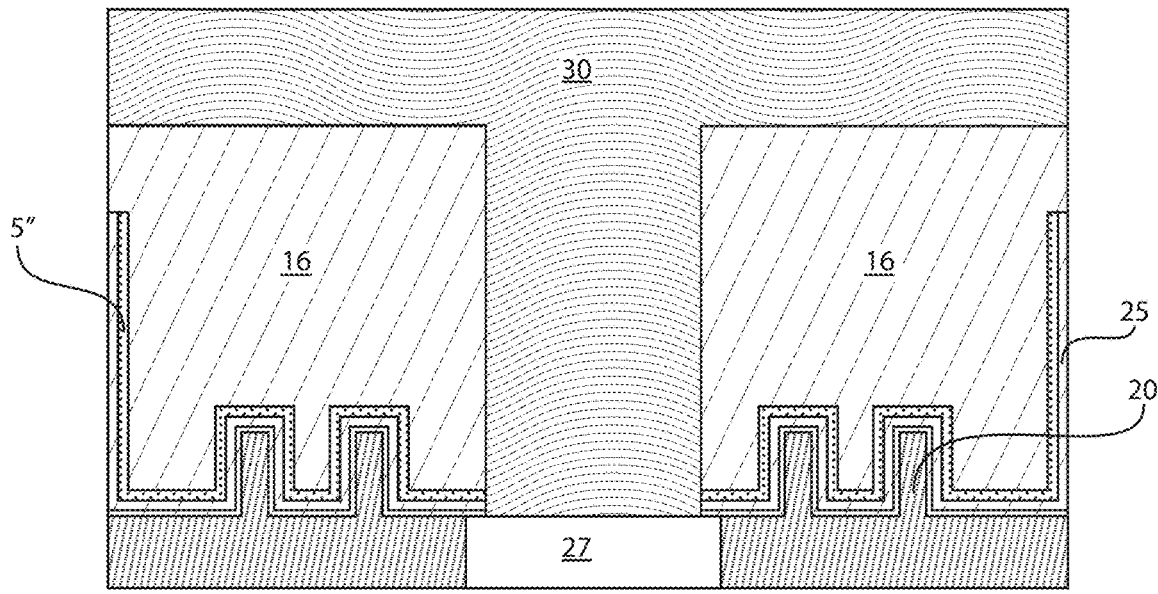
FIG. 9A is a side cross-sectional view illustrating forming a dielectric fill in a metal cut trench formed in metal gate (RMG) process, as depicted in FIG. 5B.
Figure 9B:
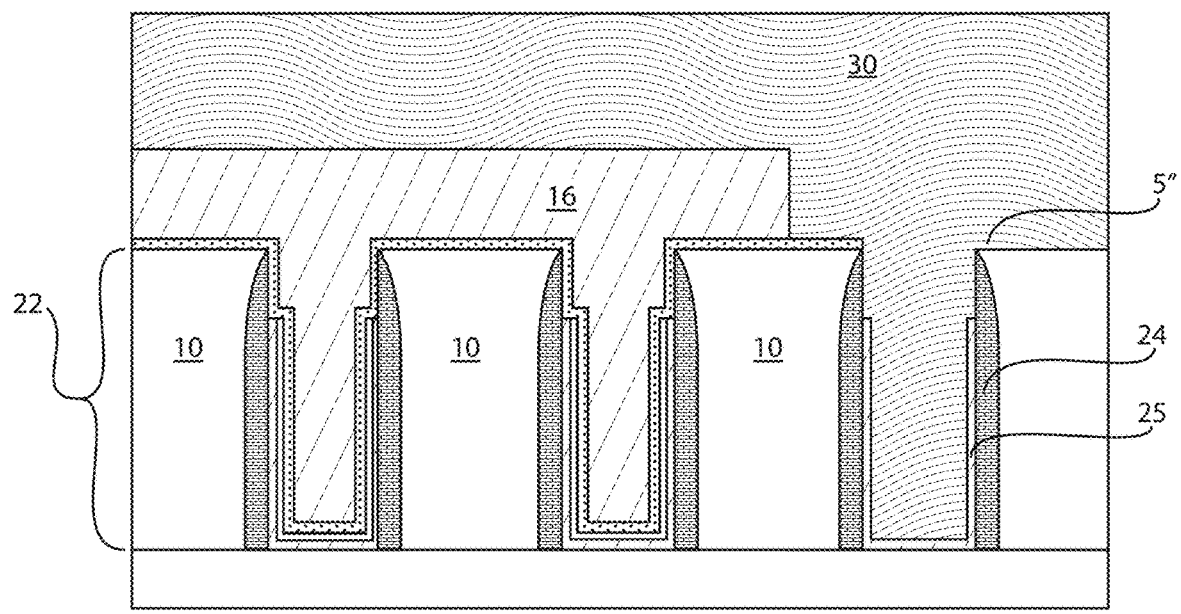
FIG. 9B is a side cross-sectional view illustrating forming the dielectric fill in the metal cut trench formed in metal gate (RMG) process, as depicted in FIG. 5C.

FIGS. 9A and 9B depict one embodiment forming dielectric 30 for an dielectric fill in metal cut trench 19 formed in metal gate (RMG) process, as depicted in FIGS. 5A-5C.

Figure 10B:
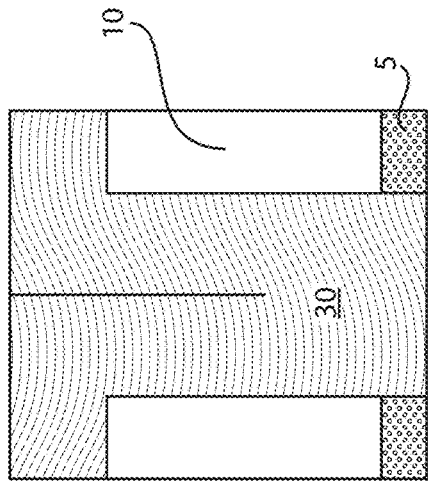
FIG. 10B is a side cross-sectional view of the structure depicted in FIG. 7A across the width of the trench.
Figure 10A:
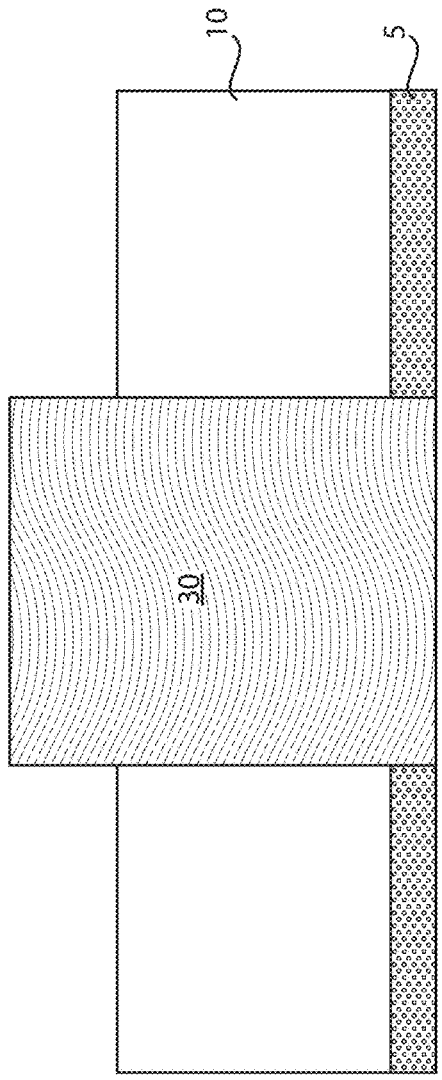
FIG. 10A is a side cross-sectional view along the length of the trench depicting one embodiment of removing the remaining portion of the organic planarization layer.

FIGS. 10A and 10B illustrate removing the remaining portion of the organic planarization layer (OPL) 16. In some embodiments, before removing the remaining portion of the organic planarization layer (OPL) 16, the structure may be planarized until the upper surface of the organic planarization layer (OPL) 16 is coplanar with the upper surface of the dielectric 30 that provides the dielectric fill. In some embodiments, the planarization process may be provided by polishing, grinding or chemical mechanical polishing (CMP). In some embodiments, a recess etch step may be substituted or used in combination with the planarization process. In some embodiments, if the patterning layer 17 has not been removed prior to this step, the process for planarizing the organic planarization layer (16) can also remove the remaining portion of the organic planarization layer (16).

The remaining portions of the organic planarization layer (OPL) 16 may then be removed using a process that does not remove the dielectric 30 that provides the dielectric fill. The process for removing the remaining portions of the organic planarization layer (OPL) 16 may also be selected to avoid removing the dielectric layer 10, i.e., interlevel dielectric layer 10.

In some embodiments, the process for removing the remaining portions of the organic planarization layer (OPL) 16 may be an ashing process. For example, the remaining portions of the organic planarization layer (OPL) 16 may be removed by a $N_2/H_2$ plasma. In other embodiments, the organic planarization layer (OPL) 16 may be removed by reactive ion etching (RIE).

Removing the remaining portion of the organic planarization layer (OPL) 16 exposes the remaining portions of the metal liner 5, which can be in contact with source and drain regions of a semiconductor device (as illustrated in FIGS. 4A-4C, 8A and 8B), be a portion of a gate structure formed using a replacement gate structure (as illustrated in FIGS. 5A-5C, 9A and 9B), or a portion of an interconnect produced during back end of the line (BEOL) processing. In some embodiments, the metal liner 5, which can include a Ti/TiN liner and cobalt seed layer) can be treated with a pre-clean process that can include diluted hydrofluoric (DHF) acid to remove surface oxidation.

The openings created by removing the remaining portions of the organic planarization layer (OPL) 16 are defined by the dielectric 30 that provides the dielectric fill and the dielectric 10 that provides the interlevel dielectric layer (ILD). These openings are filled using additive core processing, e.g., the formation of an additive conductor core, for providing electrically conductive contact structures to the remaining portions of the metal liner 5, 5', 5". As will be described below, these openings are filled with electrically conductive materials to provide contacts and/or electrically conductive structures, e.g., contacts to source/drain regions, interconnects in back end of the line (BEOL) processing, and metal layers employed in the gate structures of semiconductor devices.

Figure 11B:
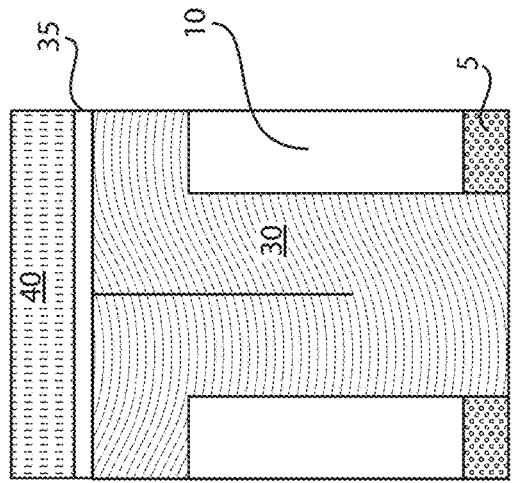
FIG. 11B is a side cross-sectional view of the structure depicted in FIG. 11A across the width of the trench.
Figure 11A:
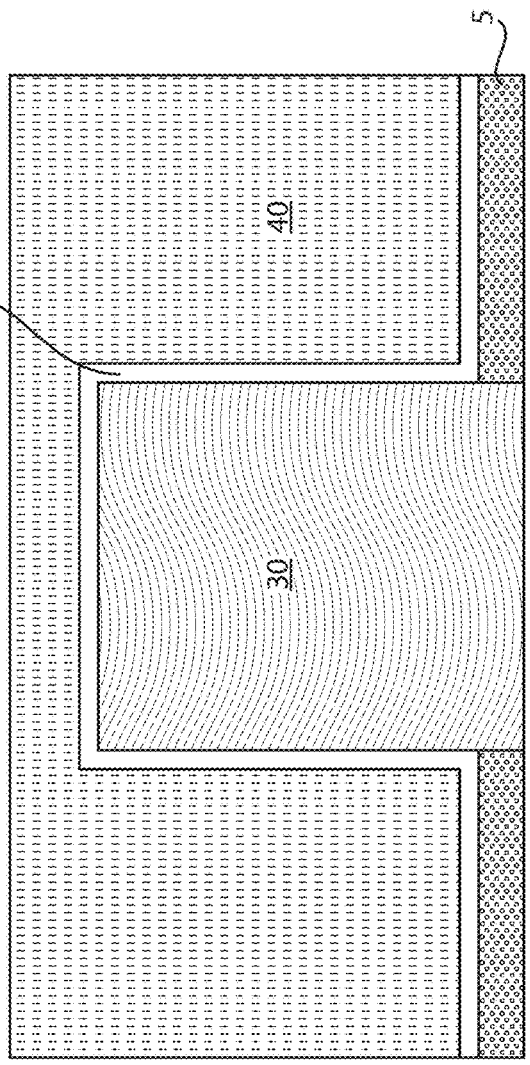
FIG. 11A is a side cross-sectional view along the length of the trench illustrating a metal liner and bulk metal core deposition for forming an additive core conductor structure, in accordance with one embodiment of the present disclosure.

FIGS. 11A and 11B illustrate a second metal liner 35 and bulk metal core 40 deposition for producing the additive conductor cores. In some embodiments, the metal liner 35 may be composed of a metal nitride, such as titanium nitride (TiN). For example, when the metal liner 5, 5', 5" (hereafter referred to as the first metal liner) described above with respect to FIGS. 1A-10B is not composed of titanium nitride, the second metal liner 35 may be titanium nitride. In other embodiments, the second metal liner 35 may be composed of another metal containing material. For example, the second metal liner 35 may be a metal nitride, such as titanium nitride (TaN). In other examples, the second metal liner 35 may be composed of a metal, such as copper (Cu), cobalt (Co), tungsten (W), platinum (Pt), aluminum (Al), silver (Ag), gold (Au), Nickel (Ni), as well as alloys and combinations thereof.

The second metal liner 35 is typically deposited directly on the first metal liner 5, 5', 5", and is typically a conformal liner. For example, the second metal liner 35 can be formed on the sidewalls of the opening provided by removing the organic planarization layer 16, e.g., on sidewall surfaces of the additive core, as well as the base of the openings, e.g., on the first metal liner 5, 5', 5". In some embodiments, the second metal liner 35 may be deposited using atomic layer deposition (ALD). In other embodiments, the second metal liner 35 may be deposited using a chemical vapor deposition (CVD) process. The chemical vapor deposition (CVD) process may be selected from the group consisting of Atmospheric Pressure CVD (APCVD), Low Pressure CVD (LPCVD) and Plasma Enhanced CVD (PECVD), Metal-Organic CVD (MOCVD) and combinations thereof may also be employed.

Following the formation of the second metal liner 35, the openings can be filled with an electrically conductive material to provide the bulk metal core 40. The electrically conductive material of the bulk metal core 40 may be a metal, such as tungsten, aluminum, copper, tungsten, titanium, tantalum, platinum, gold, silver or a combination thereof. In one example, the bulk metal core 40 is tungsten (W) or cobalt (Co) deposited on a metal liner, e.g., first metal liner 5, 5', 5" and/or second metal liner 35, that is composed of at least one of titanium, titanium nitride or a combination thereof. In one embodiment, the bulk metal core 40 may be composed of fluoride free tungsten (FFW).

In some embodiments, the electrically conductive material of the bulk metal core 40 may be deposited using a bottom up approach that does not result in seam or void formation. For example, the electrically conductive material of the bulk metal core 40 can be tungsten (W) or cobalt (Co) deposited by chemical vapor deposition (CVD). The chemical vapor deposition (CVD) process may be selected from the group consisting of Atmospheric Pressure CVD (APCVD), Low Pressure CVD (LPCVD) and Plasma Enhanced CVD (PECVD), Metal-Organic CVD (MOCVD) and combinations thereof. In another example, electrically conductive material of the bulk metal core 40 may be formed using a plating process, such as electroplating and/or electroless plating. In further embodiments, the electrically conductive material of the core 40 may be deposited using a physical vapor deposition (PVD), or atomic layer deposition (ALD) methods.

In some embodiments, the second metal liner 35 is omitted. In these embodiments, the bulk metal core 40 is formed directly on the first metal liner 5, 5', 5".

Figure 12A:
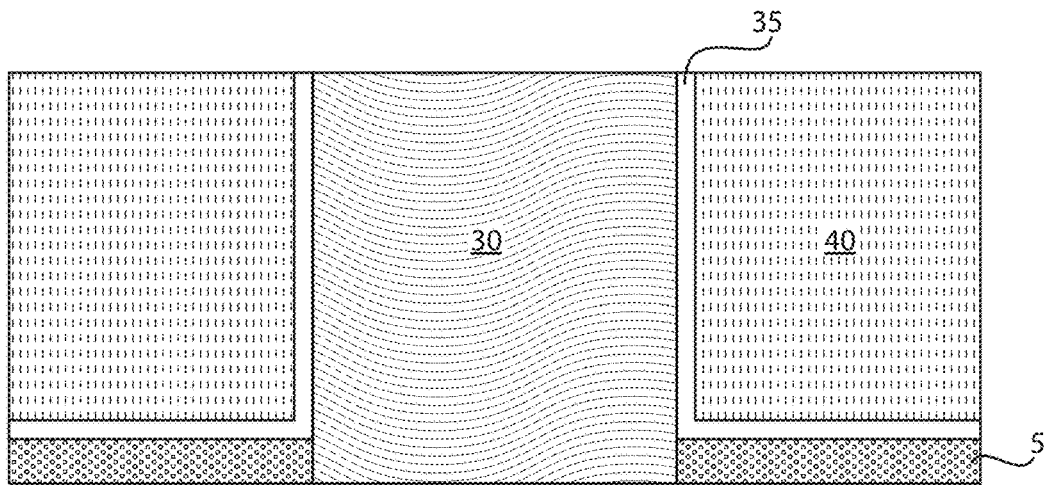
FIG. 12A is a side cross-sectional view along the length of the trench illustrating planarizing the structure depicted in FIG. 11A.
Figure 12B:
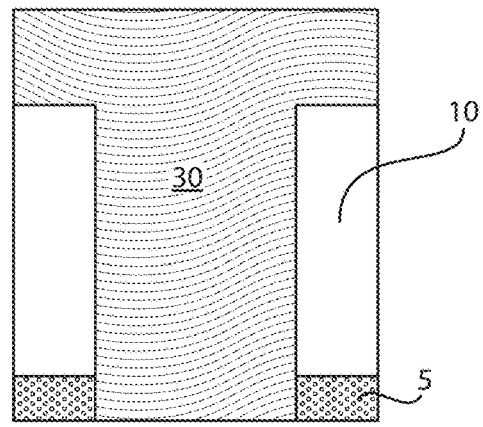
FIG. 12B is a side cross-sectional view of the structure depicted in FIG. 12A across the width of the trench.

FIGS. 12A and 12B illustrate one embodiment of planarizing the structure depicted in FIGS. 11A and 11B. The planarization process may remove the portions of the second metal liner 35 and the bulk metal core 40 that are present over the upper surface of the dielectric material 30 that provides the dielectric fill in the metal cut trench. The remaining portions of the second metal liner 35 and the bulk metal core 40 can each have an uppermost surface that is substantially coplanar with an uppermost surface of the dielectric fill 30, as depicted in FIGS. 12A and 12B. The planarization process may be provided by chemical mechanical planarization (CMP).

Figure 13B:
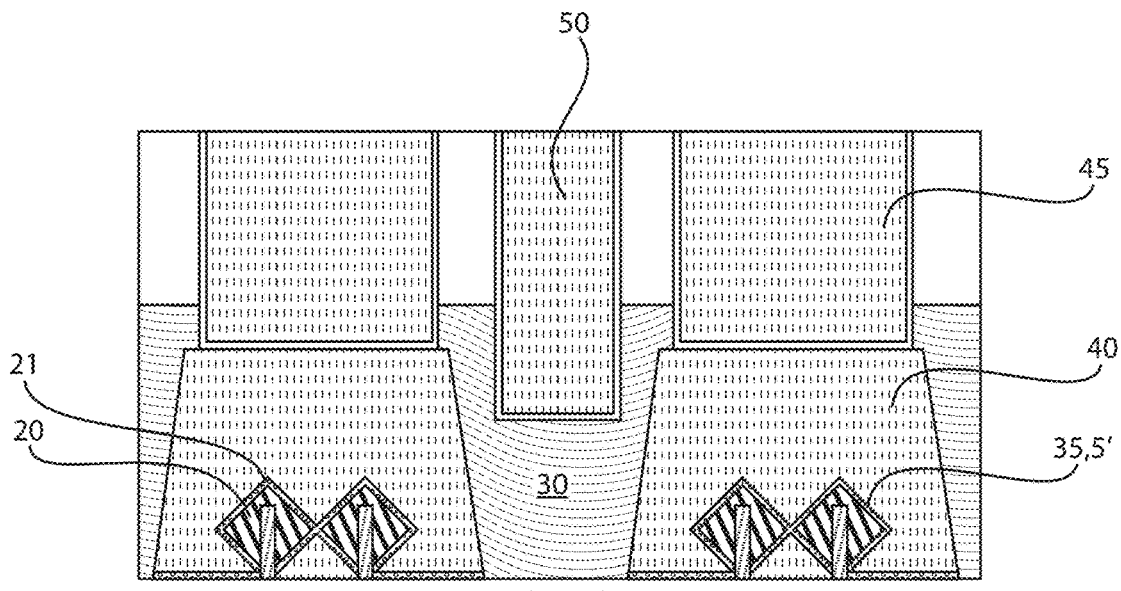
FIG. 13B is a side cross-sectional view depicting substituting the remaining portions of the organic planarization layer depicted in FIG. 8B with an electrically conductive contact structure.
Figure 13A:
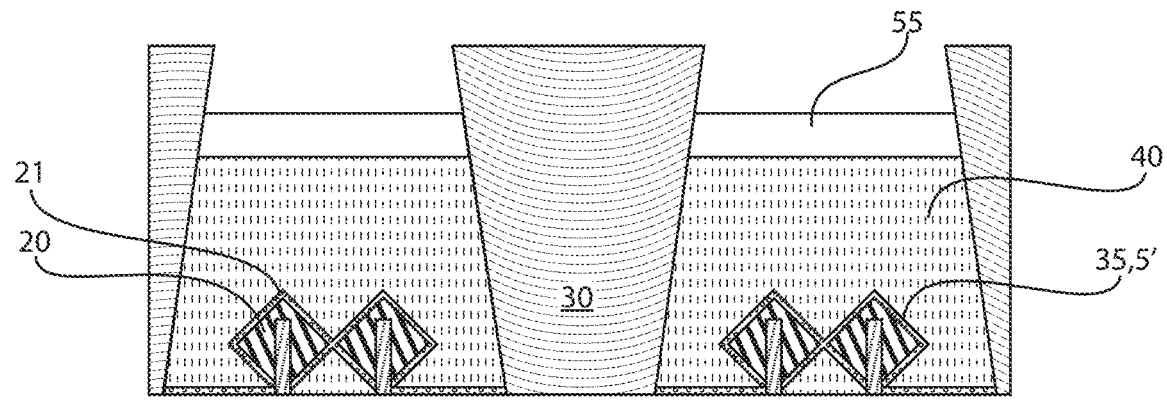
FIG. 13A is a side cross-sectional view depicting substituting the remaining portions of the organic planarization layer depicted in FIG. 8A with an additive core conductor to provide an electrically conductive contact structure.
Figure 13C:
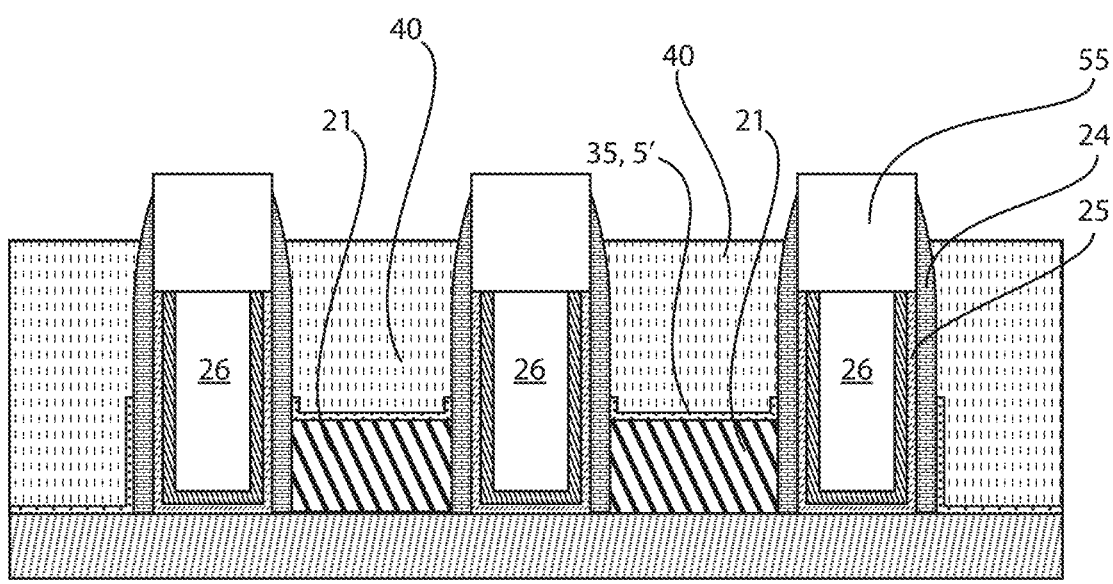
FIG. 13C is a side cross-sectional view depicting one embodiment of the merged source and drain contact structure produced using the additive core subtractive liner (ACSL) process described herein.

FIG. 13A-13C depicting substituting the remaining portions of the organic planarization layer 16 depicted in FIG. 8A with an electrically conductive contact structure including a second metal liner 35 and bulk metal core 40 as part of a middle of the line (MOL) process for forming contacts to source and drain regions. In some embodiments, a trench silicide may be formed on the source and drain regions prior to forming the additive conductive core, e.g., the second metal liner 35 and bulk metal core 40. The process steps for forming the second metal liner 35 and the bulk metal core 40 that are depicted in FIG. 13A are similar to the process steps for forming the bulk metal core 40 described with reference to FIGS. 11A-12B. The electrically conductive contacts, 35, 40 to the remaining portions of the metal liner 5' on opposing sides of the additive core 30 have a lesser width at their upper surface than at their base surface.

FIGS. 13A and 13C illustrate one embodiment of further metal contact metal process steps, in which the second metal liner 35 and the bulk metal core 40, which may include tungsten (W) and cobalt (Co), is recessed to electrically isolate merged contacts by confinement within PCs and the dielectric 30 that provides the dielectric fill within the metal cut trench, e.g., SiN plug. This can avoid the requirement for a bulk CMP (stop on SiN) and buff CMP to preserve SAC Cap 55 (reduces threat of source/drain to gate short during contact RIE). As illustrated in FIG. 13C there is no shorting of the second metal liner 35 and the bulk metal core 40.

FIG. 13B depict one embodiment of the merged source and drain contact structure produced using the additive core subtractive liner (ACSL) process described herein following further source and drain contact lithography and patterning to provide the contacts having reference numbers 45, 50

Referring to FIGS. 13A-13C, the SAC Cap 55 is preserved to minimize S/D to gate shorting. The method described with respect to FIGS. 1A-13C does not require buff CMP. The tapered contact profile can be key for gate contact to source/drain contact spacing in highly scaled SRAM layouts. More specifically, the methods disclosed herein gain additional separation between the contacts to the source and drain regions and the contact to the gate structure without any penalty to liner/metal coverage of EPI end (contact area maintained). The method described with respect to FIGS. 1A-13C reduces the likelihood of metal voiding from pinch off and enables a bottom up fill process with Co using electroplating and use of seed layer.

It is noted that the structures depicted in FIGS. 13A and 13B are after a core conductor deposition 40 and planarization and selective recess etch of both the conductive core 40 and the liners, e.g., second metal liner 35, below the SAC cap 55.

Figure 14:
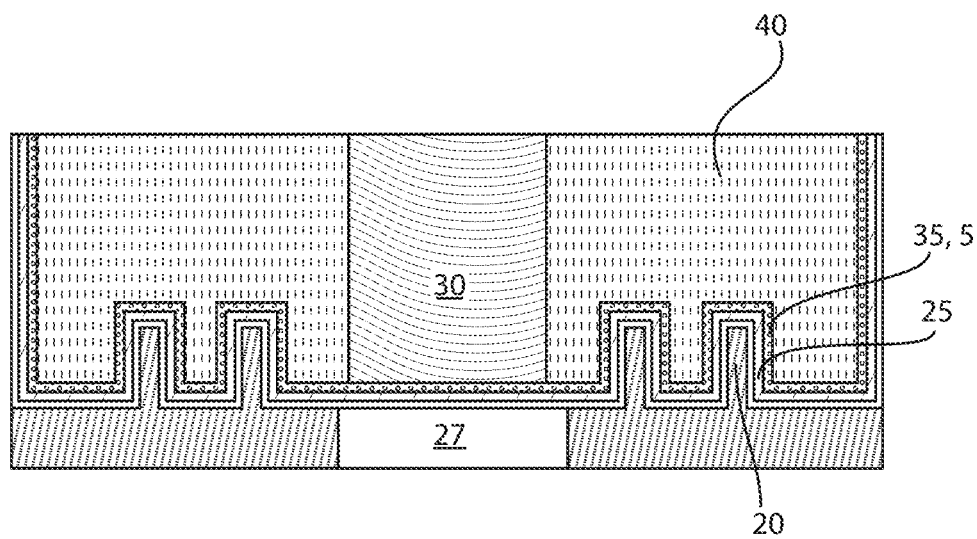
FIG. 14 is a side cross-sectional view depicting one embodiment of a gate structures formed using a replacement metal gate process (RMG) using the additive core subtractive liner (ACSL) process described herein.

FIG. 14 depicts one embodiment of a gate structures formed using a replacement metal gate process (RMG) using the additive core subtractive liner (ACSL) process described herein.

In some embodiments, the methods and structures described herein solve the gate contact to source/drain contact spacing scaling issue using the tapered contact sidewall profile. In some embodiments, the methods and structure described herein recess the organic planarization layer (OPL) 16 and metal liners 5, 5", Ti/TiN (or Ti/TiN+Co seed) liner to remove shorting between S/D contacts over gates, and also can provides more room for bulk W or Co fill to prevent pinch-off and voiding between gate structures during fill process steps. In some embodiments, selective recess of W or Co fill, i.e., bulk core metal 40, to the interlevel dielectric layer 10, e.g., SiO$_2$, SAC Cap 55, e.g., SiN, and SiN fill, i.e., dielectric 30 for the fill within the metal cut trench, allows for omitting a "buff" CMP process, which can preserve the SAC Cap 55. In some embodiments, the gate cut in replacement metal gate (RMG) process solves issues of residual a-Si in the gate extension past the end active fin.

Having described preferred embodiments of a structure and method for forming electrically conductive structures with an additive core subtractive liner (ACSL) process, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an electrically conductive structure to a device comprising:
   forming a first trench to a first portion of a metal liner;
   forming a dielectric fill in the first trench;
   forming an opening in the dielectric fill;
   removing a portion of the metal liner exposed by the opening in the dielectric fill;
   forming an isolation region in the opening; and
   replacing remaining portions of the dielectric fill with a conductor to provide contacts to remaining portions of the metal liner.

2. The method of claim 1, wherein the first trench is formed through an organic planarization layer (OPL).

3. The method of claim 1, wherein the metal liner is in contact with source/drain regions of a semiconductor device.

4. The method of claim 1, wherein the metal liner is a layer within a replacement gate structure of a replacement metal gate process.

5. The method of claim 4, wherein a high-k gate dielectric is underlying the metal liner in a gate cavity.

6. The method of claim 4, wherein a high-k gate dielectric is underlying the metal liner in a gate cavity.

7. The method of claim 1, wherein the metal liner is a component of an interconnect formed during back end of the line (BEOL) processing.

8. The method of claim 1, wherein the forming the opening in the dielectric fill is a subtractive etch method.

9. The method of claim 8, wherein the subtractive etch method is a wet chemical etch having a composition selected from the group consisting of a first mixture of ammonium hydroxide, hydrogen peroxide and water, a second mixture of hydrochloric acid, hydrogen peroxide and water, a sulfuric peroxide mixture and a combination thereof.

10. The method of claim 1, wherein the subtractive method for removing the portion of the metal liner is an atomic layer etch process.

11. The method of claim 1, wherein said forming the isolation region in the opening comprising fill the opening with a dielectric material.

12. The method of claim 11, wherein the dielectric material to fill the opening is deposited using a low temperature deposition process.

13. The method of claim 12, wherein said replacing remaining portions of the dielectric fill with a conductor to provide contacts comprises forming an additive core conductor.

14. The method of claim 12 said forming the additive core conductor comprises:
   removing the remaining portions of the second dielectric layer selective to the first dielectric layer, and the dielectric fill to provide openings to the remaining portions of the metal liner;
   filling the openings to the remaining portions of the metal liner with an electrically conductive material; and
   planarizing the electrically conductive material to provide the additive core conductor.

15. The method of claim 14, wherein the electrically conductive material filling the openings to the remaining portions of the metal liner comprises a conformal metal liner and a bulk metal core fill.

16. The method of claim 1, wherein said forming the isolation region in the opening comprises a subtractive etch process that forms a tapered sidewall trench and filling the tapered sidewall trench.

17. The method of claim 1, wherein the first trench is formed through an organic planarization layer (OPL).

18. The method of claim 1, wherein the metal liner is in contact with source/drain regions of a semiconductor device.

19. The method of claim 1, wherein the metal liner is a layer within a replacement gate structure of a replacement metal gate process.

20. A method of forming an electrically conductive structure to a device comprising:

forming a first trench to a first portion of a metal liner that is a component of an interconnect formed during back end of the line (BEOL) processing;

forming a dielectric fill in the first trench;

forming an opening in the dielectric fill;

removing a portion of the metal liner exposed by the opening in the dielectric fill;

forming an isolation region in the opening; and replacing remaining portions of the dielectric fill with a conductor to provide contacts to remaining portions of the metal liner.

\* \* \* \* \*